US010954676B2

(12) United States Patent
McBride et al.

(10) Patent No.: US 10,954,676 B2
(45) Date of Patent: Mar. 23, 2021

(54) MAGNETIC ROOF ATTACHMENT

(71) Applicant: JOHNS MANVILLE, Denver, CO (US)

(72) Inventors: Christopher McBride, Golden, CO (US); Zebonie Sukle, Denver, CO (US)

(73) Assignee: Johns Manville, Denver, CO (US)

( * ) Notice: Subject to any disclaimer, the term of this patent is extended or adjusted under 35 U.S.C. 154(b) by 0 days.

(21) Appl. No.: 16/359,439

(22) Filed: Mar. 20, 2019

(65) Prior Publication Data
US 2020/0299969 A1  Sep. 24, 2020

(51) Int. Cl.
E04D 13/16 (2006.01)
E04D 1/34 (2006.01)
F16M 13/02 (2006.01)
H02S 20/23 (2014.01)
H02S 30/10 (2014.01)
H05K 9/00 (2006.01)

(52) U.S. Cl.
CPC .......... E04D 13/1606 (2013.01); E04D 1/34 (2013.01); F16M 13/022 (2013.01); H02S 20/23 (2014.12); H02S 30/10 (2014.12); H05K 9/0075 (2013.01); E04D 2001/3414 (2013.01)

(58) Field of Classification Search
CPC .................................................. E04D 13/1606
USPC ..................................................... 52/DIG. 4
See application file for complete search history.

(56) References Cited

U.S. PATENT DOCUMENTS

| 4,038,804 | A  | * | 8/1977 | Haage | E04D 5/142 |
|   |   |   |   |   | 52/746.11 |
| 4,519,172 | A  | * | 5/1985 | Ristow | E04D 5/143 |
|   |   |   |   |   | 52/410 |
| 8,020,517 | B2 | * | 9/2011 | Seay | A01K 31/002 |
|   |   |   |   |   | 119/453 |
| 8,826,618 | B2 | * | 9/2014 | Stearns | E04D 13/10 |
|   |   |   |   |   | 52/410 |
| 2009/0211621 | A1 | * | 8/2009 | LeBlanc | H01L 31/0392 |
|   |   |   |   |   | 136/244 |
| 2013/0298494 | A1 | * | 11/2013 | Corsi | E04B 1/40 |
|   |   |   |   |   | 52/705 |
| 2014/0060645 | A1 | * | 3/2014 | Rummens | H02S 20/23 |
|   |   |   |   |   | 136/256 |
| 2014/0102556 | A1 | * | 4/2014 | Malpas | H02S 20/23 |
|   |   |   |   |   | 137/360 |
| 2017/0367306 | A1 | * | 12/2017 | McCord | A01K 39/012 |
| 2018/0243855 | A1 | * | 8/2018 | Scheerer | B23K 13/01 |

(Continued)

Primary Examiner — Babajide A Demuren
(74) Attorney, Agent, or Firm — Robert D. Touslee

(57) ABSTRACT

A rooftop equipment attachment system includes a rooftop having a roof deck, an insulation layer positioned atop the roof deck, a plurality of metallic roof plates that secure the insulation layer to the roof deck, and a roofing membrane secured atop the insulation layer. The roofing membrane covers the plurality of metallic roof plates. The system includes a frame for supporting rooftop equipment. The frame includes a plurality of mounting supports that are positionable atop the rooftop at positions that are above at least a portion of the plurality of metallic roof plates. The plurality of mounting supports are configured to support the frame and any rooftop equipment mounted thereon. Each of the plurality of mounting supports includes a magnetic element that is configured to secure a particular one of the plurality of mounting supports with a particular one of the plurality of metallic roof plates.

19 Claims, 6 Drawing Sheets

(56) References Cited

U.S. PATENT DOCUMENTS

2019/0081587 A1* 3/2019 Mayfield ................ H02S 20/23
2020/0096155 A1* 3/2020 Georgeau ................ F16L 3/24

* cited by examiner

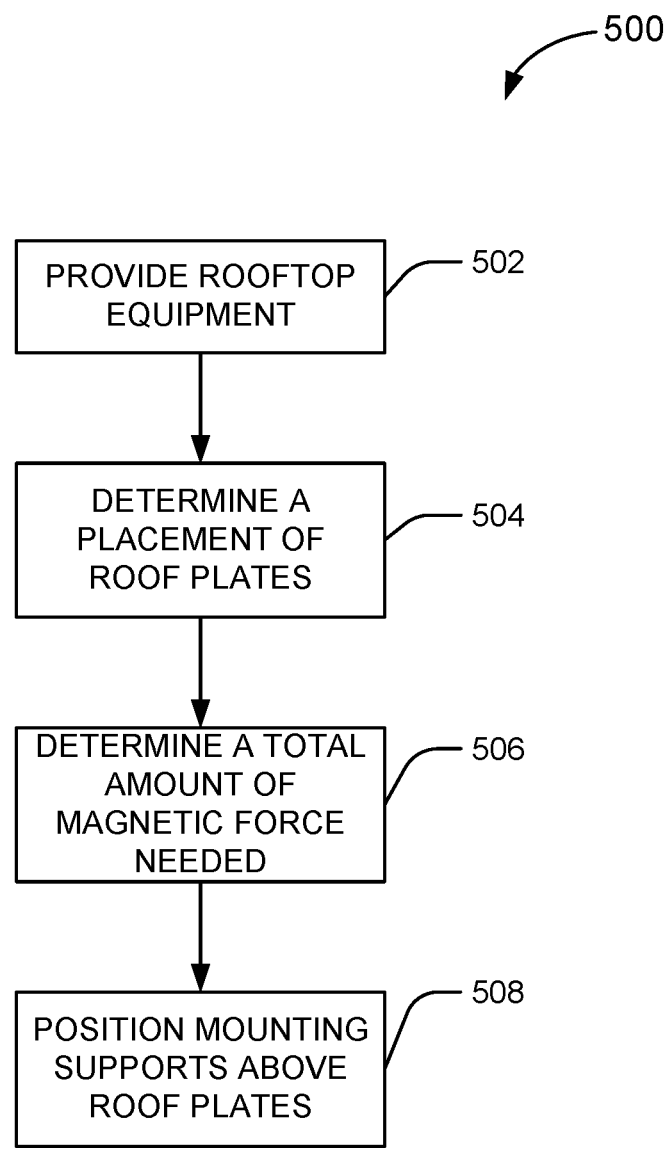

MAGNETIC ROOF ATTACHMENT

BACKGROUND OF THE INVENTION

Currently, there are two primary methods of attaching rooftop equipment to a roof. A first technique is to add ballast to the legs of the equipment to stabilize the equipment. Using ballast to secure rooftop equipment often overload or underloads the equipment. For example, ballasted rooftop equipment may have enough weight to prevent the equipment from blowing off the roof, but oftentimes do not have sufficient weight to prevent the equipment from chattering and/or sliding, which damages the roofing membrane. In other instances, ballasting may overload the roof by point loading weight, which may damage the structure of the roof. The second technique is to attach the equipment to the roof structure by penetrating the roof membrane. However, mechanical attachment to the roof requires the roofing membrane to be punctured, which pierces the building's watertight layer. The greater the number of penetrations, the greater the chance of leaks into the building. Improvements in roof attachment techniques are desired.

BRIEF SUMMARY OF THE INVENTION

Embodiments of the present invention are directed to systems for securing rooftop equipment to rooftops using magnetic attachment mechanisms. The systems described herein may be integrated into existing roofing systems and/or may be designed and constructed along with the building and/or roof structure itself. Such systems allow large rooftop structures, such as solar panels, cellular communications towers, satellite antennas, other communications systems, HVAC systems, and/or other rooftop systems to be secured to a rooftop without requiring any fastening mechanisms to puncture the roofing membrane. Such techniques allow for quick and easy installation of rooftop equipment with no modifications to existing roofing structures.

In one embodiment, a rooftop equipment attachment system is provided. The attachment system may include a rooftop having a roof deck, an insulation layer positioned atop the roof deck, a plurality of metallic roof plates that secure the insulation layer to the roof deck, and a roofing membrane secured atop the insulation layer. The roofing membrane may cover the plurality of metallic roof plates. The attachment system may also include a frame for supporting rooftop equipment. The frame may include a plurality of mounting supports that may be positionable atop the rooftop at positions that are above at least a portion of the plurality of metallic roof plates. The plurality of mounting supports may be configured to support the frame and any rooftop equipment mounted thereon. Each of the plurality of mounting supports may include a magnetic element that is configured to secure a particular one of the plurality of mounting supports with a particular one of the plurality of metallic roof plates.

In another embodiment, a rooftop equipment attachment system may include a frame for supporting rooftop equipment and a plurality of mounting supports that may be coupled with the frame. The plurality of mounting supports may be positionable atop a rooftop such that each of the plurality of mounting supports is disposed above at least one of a plurality of metallic roof plates provided in a structure of the rooftop. The plurality of mounting supports may be configured to support the frame and any rooftop equipment mounted thereon. Each of the plurality of mounting supports may include a magnetic element that is configured to secure a particular one of the plurality of mounting supports with a particular one of the plurality of metallic roof plates.

In another embodiment, a method of installing rooftop equipment to a roof is provided. The method may include selecting rooftop equipment to be placed atop a roof of a building structure and determining a placement of a plurality of metallic roof plates positioned about an area of the roof. The method may also include determining a total amount of magnetic force needed to secure the rooftop equipment. The total amount of magnetic force may be based at least in part on a relative location of a final position of the rooftop equipment on a top of the roof. The method may further include positioning a plurality of mounting supports of the rooftop equipment above at least some of the plurality of metallic roof plates. Each of the plurality of mounting supports may include a magnetic element that is configured to secure a particular one of the plurality of mounting supports with a particular one of the plurality of metallic roof plates. A magnetic force of each of the magnetic elements may be based at least in part on the total amount of magnetic force and a number of the plurality of mounting supports of the rooftop equipment.

BRIEF DESCRIPTION OF THE DRAWINGS

A further understanding of the nature and advantages of various embodiments may be realized by reference to the following figures. In the appended figures, similar components or features may have the same reference label. Further, various components of the same type may be distinguished by following the reference label by a set of parentheses containing a second label that distinguishes among the similar components. If only the first reference label is used in the specification, the description is applicable to any one of the similar components having the same first reference label irrespective of the second reference label.

FIG. 5 is a flowchart illustrating a process for installing rooftop equipment to a roof according to embodiments of the invention.

DETAILED DESCRIPTION OF THE INVENTION

The subject matter of embodiments of the present invention is described here with specificity to meet statutory requirements, but this description is not necessarily intended to limit the scope of the claims. The claimed subject matter may be embodied in other ways, may include different elements or steps, and may be used in conjunction with other existing or future technologies. This description should not be interpreted as implying any particular order or arrangement among or between various steps or elements except when the order of individual steps or arrangement of elements is explicitly described.

Embodiments of the present invention are directed to improved techniques for attaching rooftop equipment to a roof using magnetic and/or electromagnetic forces. By using magnetic force, the rooftop equipment may be attached to existing roof plates installed beneath the membrane without penetrating the roof membrane. The plates used for attachment may be standard insulation and/or membrane plates and/or plates that are specifically designed to serve as magnetic attachment points. In some embodiments, the magnetic components may have an adjustable base so the magnet concentration per area can be set to match the wind load requirement of a particular location/application and/or to work with the positions of existing roofing plates.

Figure 1:
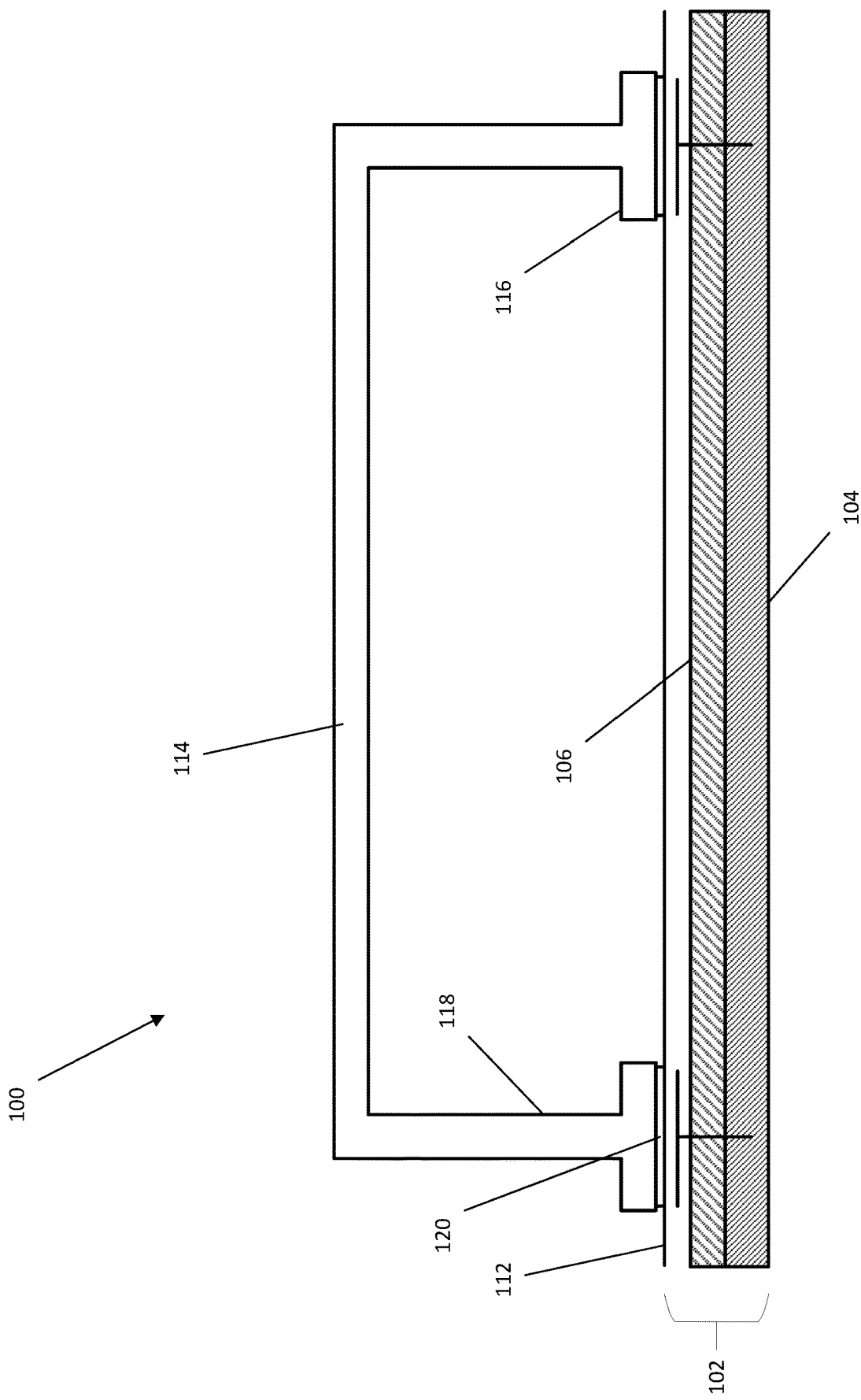
FIG. 1 depicts a roof attachment system according to embodiments of the invention.

Turning to FIG. 1, one example of a roof attachment system 100. As illustrated here, roof attachment system 100 includes a roof structure 102. The roof structure 102 is typically a flat roof (technically speaking flat roofs are not flat, as code requires ¼" slope for every foot as a minimum, however, such roofs with pitches of less than about 10 degrees may be considered flat roofs in accordance with the present invention, such as a low slope roof, and may include a roof deck 104. As illustrated, roof deck 104 is formed from corrugated steel, however, other roof deck materials and designs are possible. For example, a generally flat roof deck 104 may be provided that is made of steel, concrete, wood, and/or other high load-bearing material One or more insulation layers 106 may be positioned atop the roof deck 104 (either directly or within one or more intermediate layers positioned there between). For example, the insulation layer 106 may include a number of insulation boards, such as foam core panels, gypsum cover boards, cement and/or glass cover boards, glass-mat roof boards, cellulose fiber roof boards, perlite cover boards, and/or other cover boards. In some embodiments, one or more surfaces of the insulation boards may include a facer, such as a glass mat facer. While typically described in the context of insulation boards, it will be appreciated that in some embodiments other types of insulation materials may be used alone or in conjunction with insulation boards to form the insulation layer 106.

The insulation layer 106 may be secured to the roofing deck 104 using a number of metallic roof plates 108. Each roof plate 108 may be a relatively thin metallic plate, which may have any shape from a top view. For example, the roof plates 108 may have a generally circular or rectangular shape when viewed from above and may be formed from a ferromagnetic material. Oftentimes, the roof plates 108 may have lateral surface areas of between about 4 and 16 square inches, with areas of between about 8 and 12 square inches being most common. For example, in some embodiments, the roof plates 108 may be circular in shape and have diameters between about 2 and 4 inches, with 3 inches being common. In other embodiments, the roof plates 108 may be non-circular and/or have other dimensions.

The roof plates 108 may be positioned atop the insulation layer 106, often in predetermined patterns as discussed in greater detail below. The roof plates 108 may include one or more fastening devices 110 that are useable to secure the roof plates 108 to the roof deck 104, which effectively serves to clamp the insulation layer 106 between the roof plates 108 and the roof deck 104. For example, a nail, screw, and/or other fastening device 110 may be inserted through an aperture formed in a body of the roof plate 108 (oftentimes through a center of the roof plate 108), through the insulation layer 106, and into the roof deck 104. The fastening device 110, when tightened, may draw the roof plate 108 toward the roof deck 104 such that the insulation layer 106 is sandwiched between the roof plate 108 and the roof deck 104. Oftentimes, when insulation layer 106 includes a number of insulation boards, each of the boards is secured to the roof deck 104 using a number of roof plates 108. As just one example, each roofing board (which is typically about 4 feet wide by 8 feet long, although other dimensions are possible) may be secured using between about 6 and 42 roof plates 108 per insulation board, with between about 8 and 32 roof plates 108 being more common. The roof plates 108 may be arranged at regular and/or irregular intervals on the face of the insulation board as will be discussed in greater detail below in relation to FIGS. 3A-3C.

A roofing membrane 112 may be positioned on top of the insulation layer 106 and possibly the roof plates 108. The roofing membrane 112 may be thermoplastic polyolefin (TPO) membranes, elastomeric styrene-butadiene-styrene (SBS) membranes, atactic polypropylene (APP), hybrid variations of APP and SBS membranes, polyethylene membranes, polyvinyl chloride (PVC) membranes, ethylene propylene diene monomer (EPDM) membranes, and/or other roofing membranes. In some embodiments, the roofing membrane 112 may also include or be formed from asphalt. In some embodiments, the roofing membrane 112 may be secured to the roof structure 102 using mechanical fasteners. For example, mechanical fasteners, which may be similar and/or the same as those used to secure the insulation layer 106 to the roof deck 104. In some embodiments, the mechanical fasteners may be the roof plates 108 themselves. In other embodiments, instead of (or in addition to) using mechanical fasteners to secure the roofing membrane 112 to the roof structure 102, adhesive and/or inductive welding may be used. For example, an adhesive may be applied to an interface between an underside of the roofing membrane 112 and a top surface of the insulation layer 106. In other embodiments, the roofing membrane 112 may be inductive welded to the insulation layer 106 and/or the roof plates 108. Oftentimes, any mechanical fasteners are utilized in a manner so as to not penetrate the weather exposed surface of a membrane. For example, the fasteners may be concealed under a heat welded lap.

In some embodiments, roofing equipment may be attached to the roof structure 102. As just a few examples, the rooftop equipment may include solar panels, satellite communications antennas, cellular communications towers and/or antennas, HVAC systems, other communications systems, and/or other equipment. Such rooftop equipment may need to be secured to the roof to prevent movement of the equipment once placed, especially during periods in which the rooftop and rooftop equipment experience high wind loads. To adequately secure the roofing equipment to the roof structure 102, a roofing rack or mounting frame 114 may be attached to the roofing equipment, with the frame 114 including a number of feet or mounting supports 116 that may be positioned atop the roof structure 102, such as by being placed on top of the roofing membrane 112 and/or other top surface of the roof structure 102. In some embodiments, the frame 114 may be formed integrally with and/or otherwise formed specifically to integrate with a particular piece of rooftop equipment. In other embodiments, the frame 114 may be designed to retrofit existing rooftop equipment for mounting of the roof structure 102. In some embodiments, the feet or mounting supports 116 may be secured to the rest of the frame 114 using one or more adjustable legs 118. The legs 118 may be adjustable and/or otherwise translatable in at least two directions. For example, the legs 118 may be adjustable laterally along a first axis and a second axis with the axes being substantially orthogonal to one another. In other embodiments, the legs 118 may be translatable in only one lateral direction. In some embodiments, the legs 118 may be translatable vertically, which may allow the mounting supports 116 to be raised and lowered to account for variations in height of the roof structure 102. To adjust the position of the legs 118, some or all of the legs 118 may include telescoping supports, pivoting supports, slidable rails, and/or other features that enable lateral and/or vertical adjustments.

Each of the mounting supports 116 may include and/or be formed of at least one magnetic element 120, oftentimes being coupled to and/or forming a bottom surface of the mounting support 116. In some embodiments, the magnetic elements 120 may be exposed, while in other embodiments, the magnetic elements 120 may be fully encased by the mounting supports 116. For example, in some embodiments magnetic element 120 may be received within a chamber formed within an interior of a mounting support 116, while in other embodiments a magnetic element 120 may be fastened adhered, snap fit, and/or otherwise affixed to a bottom of the mounting support 116. Oftentimes, a bottom surface of the mounting support 116 and/or the magnetic element 120 may have a smooth surface, with rounded edges. Such designs help ensure that in the event of any movement of the frame 114 there is minimal damage inflicted on the membrane layer 112 and/or other top layer of the roof structure 102.

Magnetic elements 120 may include permanent magnets and/or electromagnets. Embodiments using electromagnets may be particularly useful as the current provided to each electromagnet may be reduced and/or cut off entirely, which may allow the magnetic element 120 and/or mounting support 116 to be more easily moved or removed, which may enable simpler and quicker repositioning, cleaning, replacement repair, and/or other maintenance tasks to be performed without risking damage to the roofing membrane 112. Additionally, electromagnets may allow each mounting support 116 to include identical magnetic elements 120, while still enabling the magnetic force of some or all of the magnetic elements 120 to be different. This may be done, for example, by adjusting an amount of current supplied to some or all of the electromagnets to increase or decrease the magnetic force. This may be particularly useful in applications where a portion of the rooftop equipment and/or frame 114 is in a portion of the rooftop that faces higher wind loads.

The mounting supports 116 and magnetic elements 120 may be positioned directly above some or all of the roof plates 108. In such positions, the magnetic elements 120 are attracted to the roof plates 108 positioned beneath the membrane layer 112 to secure the frame 114 and any attached roofing equipment to the roof structure 102. Oftentimes, the magnetic elements 120 may have a similar cross-sectional shape, size, and/or area that substantially matches that of the roof plates 108. This serves to maximize the magnetic attraction and allow for a greatest amount of movement of the magnetic element 120 relative to the roof plate while still remaining magnetically engaged with the roof plate 106. Each of the magnetic elements 120 may be selected based on a total magnetic force needed to securely attach the frame 114 and any rooftop equipment mounted thereon to the roof structure 102, as well as a number of mounting supports and/or magnetic elements used. The total amount of magnetic force needed may be based not only on the size, weight, and/or aerodynamic profile of the rooftop equipment, but also by particular position of the roof on which the frame 114 is mounted. Oftentimes, the total magnetic force may include a factor of safety (such as 2× the minimum magnetic force needed to secure the frame 114 and equipment to the roof structure 102). This is because the wind profiles and engineering requirements for rooftops vary based on the rooftop position as discussed in greater detail in relation to FIG. 4. The magnetic force of each magnetic element 120 may be selected to form a portion of the total magnetic force needed and may vary based on the number of mounting supports 116 and/or magnetic elements 120 used in a particular application or frame 114. For example, if 20 magnetic elements are utilized on the frame 114, each one may have a magnetic force that is equal to 0.05 of the total force. However, in some embodiments some or all of the magnetic elements 120 may have different amounts of magnetic force. This may be particularly useful in applications where a portion of the rooftop equipment and/or frame 114 is in a portion of the rooftop that faces higher wind loads. For example, a portion of the frame 114 positioned more proximate to corners of the rooftop may include mounting supports 116 having magnetic elements 120 with stronger magnetic forces than magnetic elements 120 disposed on mounting supports 116 of a portion of the frame 114 positioned more proximate a center of the rooftop.

Figure 2A:
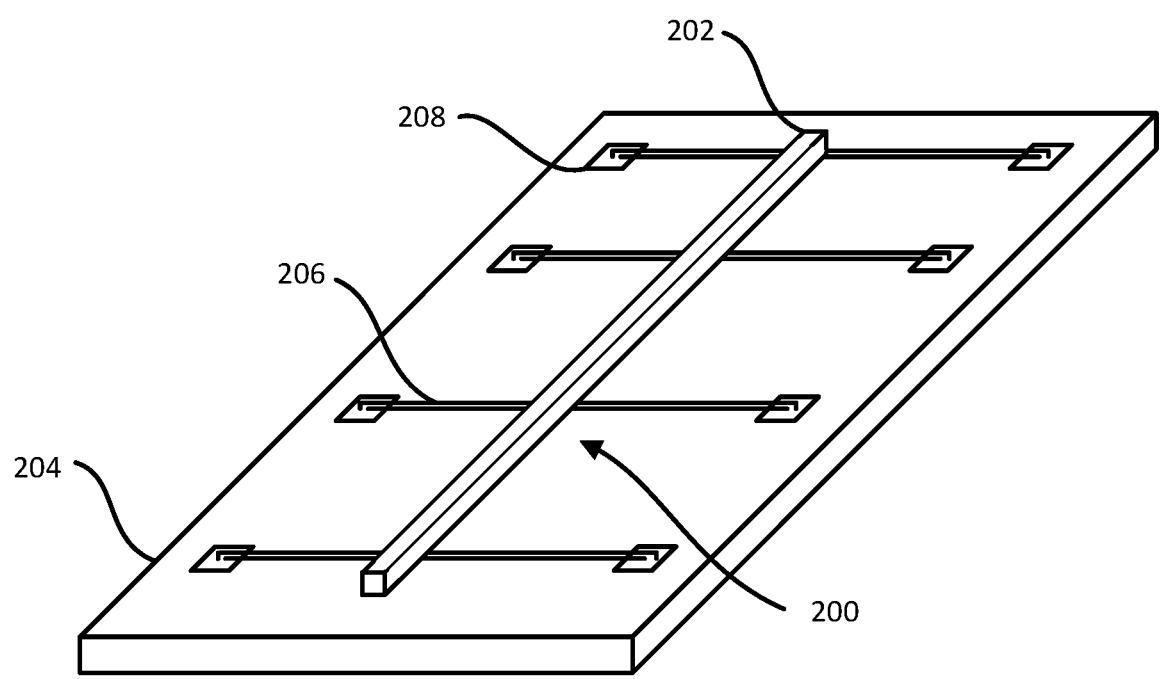
FIG. 2A depicts a frame for mounting equipment to a rooftop according to embodiments of the invention.

FIG. 2A depicts a frame 200, which may be similar to frame 114, that includes at least one primary frame support 202 that provides a mounting location that is useable to secure rooftop equipment to a roof structure 204. While illustrated as a single elongate support beam, it will be appreciated that primary frame support 202 may be formed from any number of members and may have significantly more complex designs where necessitated by a particular application. For example, the frame 200 may include any number of trusses, girders, and/or other structural elements that form all or a portion of the primary frame support 202 and/or other portion of the frame 200. Attached to primary frame support 202 are a number of legs 206, which may be similar to legs 118. Legs 206 may be adjustable in one or more directions. For example, one or more portions of each leg 206 may be extendable and/or retractable lengthwise, laterally slidable, pivotally attached to the primary frame support 202 and/or otherwise translatable in one or more directions, including vertical and/or lateral directions. This allows a position of a foot or mounting support 208 coupled with an end of each leg 206 to be adjusted. This allows each of the mounting supports 208 to be positioned over a roof plate (not shown) that is provided in the roof structure 204. Each of the mounting supports 206 may include one or more magnetic elements (not shown, but similar to magnetic elements 120). While shown having 8 mounting supports 208 on 4 opposing legs 206, it will be appreciated that any number of legs 206, mounting supports 208, magnetic elements, and/or other elements may be included on a single frame 200 to meet the needs of a particular application/piece of rooftop equipment and/or the available arrangement of roof plates within roof structure 204. Moreover, while illustrated having a symmetrical design, it will be appreciated that any arrangement of components may be utilized in designing frame 200. As just one example, a portion of the frame 200 positioned more proximate to corners of the rooftop may include a greater density of mounting supports 208 than a portion of the frame 200 positioned more proximate a center of the rooftop. This may be particularly useful in embodiments in which a single frame 200 extends into multiple roofing zones as described in greater detail with respect to FIG. 4.

Figure 2B:
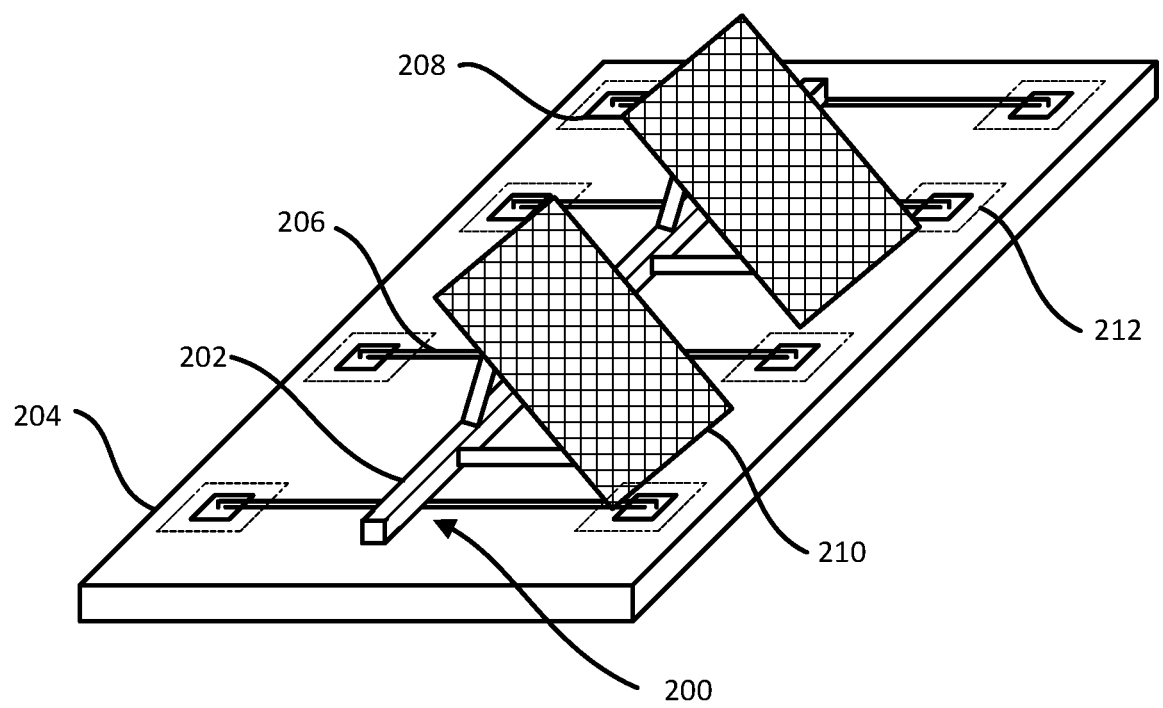
FIG. 2B depicts the frame of FIG. 2A with roofing equipment mounted thereon.

FIG. 2B illustrates roofing equipment 210 in the form of a solar panel assembly mounted atop the frame 200. As illustrated, a magnetic shielding material 212 is provided between the roofing equipment 210 and the magnetic elements, which may be particularly useful in embodiments where the roofing equipment 210 includes communications equipment. It will be appreciated that other types of rooftop equipment and/or arrangements of solar panel assemblies may be mounted to a roof structure 102 using a frame 200.

Figure 3A:
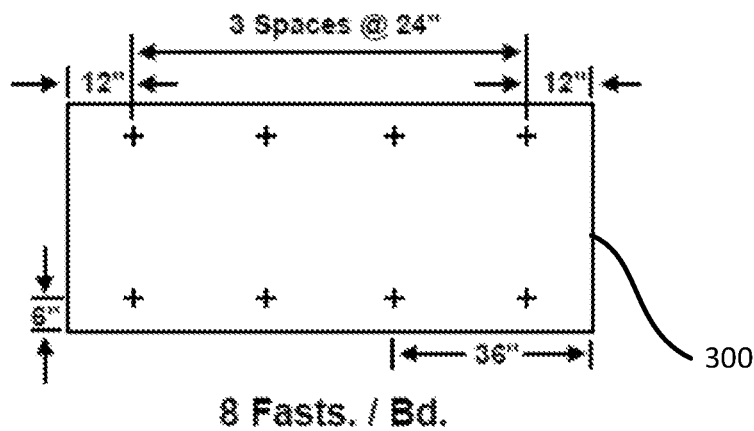
FIG. 3A depicts a fastening arrangement for roofing equipment according to embodiments of the invention.
Figure 3B:
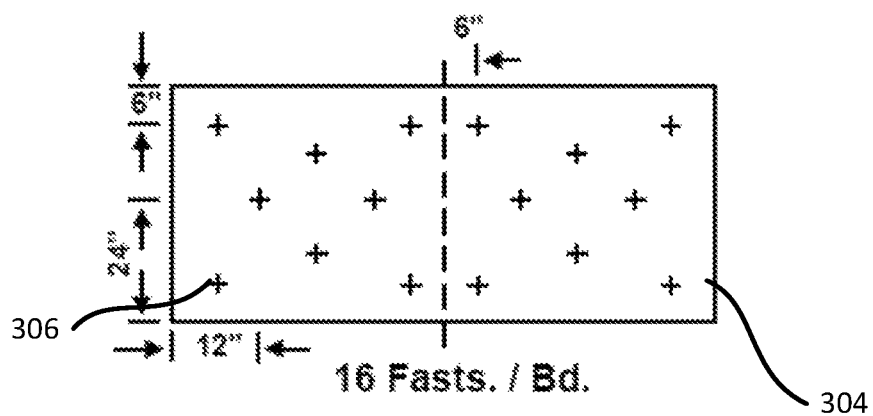
FIG. 3B depicts a fastening arrangement for roofing equipment according to embodiments of the invention.
Figure 3C:
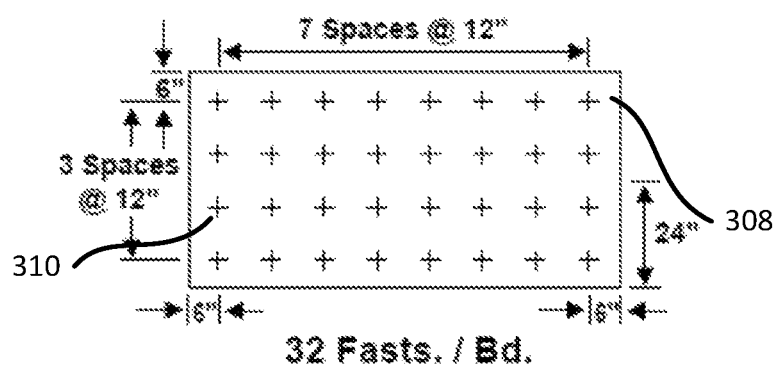
FIG. 3C depicts a fastening arrangement for roofing equipment according to embodiments of the invention.

FIGS. 3A-3C illustrate a number of configurations of fastening positions and/or attachment points for a frame, such as frame 114 and/or frame 200. These attachment points may represent positions of roof plates that are used to secure an insulation board to a roof deck. As described above, each insulation board may include between about 6 and 42 roof plates, however, other numbers of roof plates are possible in accordance with the present invention. The roof plates may be arranged at equal or irregular intervals along each insulation board. Additionally, it will be appreciated that a single roof structure may include a number of different arrangements of insulation board fastening patterns, with such patterns typically being driven by the relative location of a particular insulation board on the rooftop, as described in greater detail in relation to FIG. 4.

FIG. 3A illustrates one example of a fastening arraignment of an insulation board 300 having 8 attachment points 302 (which may be in the form of roof plates) that are used to secure the insulation board 300 to a roof deck (not shown). As illustrated, the insulation board 300 is approximately 4 feet by 8 feet, although other sized insulation boards may be used and may have similar fastening patterns. Insulation board 300 includes 8 attachment points 302 in two symmetrical rows of 4 attachment points 302 in each row. The attachment points 302 have centers that are spaced apart from one another by approximately 24 inches along a length of the insulation board 300, with attachment points 302 closest to the ends of the length of the insulation board 300 being spaced apart from an edge of the insulation board 300 by approximately 12 inches. The rows of attachment points 302 may be spaced apart from one another by approximately 36 inches, with attachment points 302 closest to the ends of the width of the insulation board 300 being spaced apart from an edge of the insulation board 300 by approximately 6 inches. It will be appreciated that embodiments of the present invention may deviate from the particular arrangement of attachment points illustrated in FIG. 3A and that the distances between the various attachment points 302 and/or the edges of the insulation board 300 may be adjusted to meet the needs of a particular application. Additionally, while shown with equidistant spacing between the attachment points along the width and/or length of the insulation board 300, in some embodiments irregular spacing intervals may be used. Additionally, in some embodiments additional or fewer rows or columns of attachment points 302 may be utilized.

FIG. 3B illustrates one example of a fastening arraignment of an insulation board 304 having 16 attachment points 306 (which may be in the form of roof plates) that are used to secure the insulation board 304 to a roof deck (not shown). As illustrated, the insulation board 304 is approximately 4 feet by 8 feet, although other sized insulation boards may be used and may have similar fastening patterns. Insulation board 300 includes 16 attachment points 306 in five rows, with the first, third, and fifth rows including 4 attachment points 306, while the second and fourth rows includes 2 attachment points 306. The relative positions of each of the attachment points 306 may be determined by dividing the insulation board 304 in half, bisecting the length of the insulation board 304. For example, the attachment points 306 in the first and fifth rows have centers that are spaced apart from ends of the length of the insulation board 304 (or the center line of the insulation board, whichever is closer) by approximately 6 inches. Each of the attachment points 306 of the first row and the fifth row may be positioned approximately 6 inches from the closest width edge of the insulation board 304. The attachment points 306 in the third row have centers that are spaced apart from ends of the length of the insulation board 304 (or the center line of the insulation board, whichever is closer) by approximately 12 inches. Each of the attachment points 306 of the third row may be positioned approximately 24 inches from the closest width edge of the insulation board 304. The attachment points 306 in the second and fourth rows have centers that are spaced apart from ends of the length of the insulation board 304 (or the center line of the insulation board, whichever is closer) by approximately 24 inches. Each of the attachment points 306 of the second row and the fourth row may be positioned between approximately 12 inches and 18 inches from the closest width edge of the insulation board 304. It will be appreciated that embodiments of the present invention may deviate from the particular arrangement of attachment points illustrated in FIG. 3B and that the distances between the various attachment points 306 and/or the edges of the insulation board 300 may be adjusted to meet the needs of a particular application. Additionally, while shown with irregular spacing between the attachment points 306 within the various row and columns, in some embodiments regular spacing intervals may be used. Additionally, in some embodiments additional or fewer rows or columns of attachment points 306 may be utilized.

FIG. 3C illustrates one example of a fastening arrangement of an insulation board 308 having 32 attachment points 310 (which may be in the form of roof plates) that are used to secure the insulation board 308 to a roof deck (not shown). As illustrated, the insulation board 308 is approximately 4 feet by 8 feet, although other sized insulation boards may be used and may have similar fastening patterns. Insulation board 308 includes 32 attachment points 310 arranged in four symmetrical rows of 8 attachment points 310 in each row. The attachment points 310 have centers that are spaced apart from one another by approximately 12 inches along a length of the insulation board 308, with attachment points 310 closest to the ends of the length of the insulation board 308 being spaced apart from an edge of the insulation board 308 by approximately 6 inches. The rows of attachment points 310 may be spaced apart from one another by approximately 12 inches, with attachment points 310 closest to the ends of the width of the insulation board 308 being spaced apart from an edge of the insulation board 308 by approximately 6 inches. It will be appreciated that embodiments of the present invention may deviate from the particular arrangement of attachment points illustrated in FIG. 3C and that the distances between the various attachment points 310 and/or the edges of the insulation board 308 may be adjusted to meet the needs of a particular application. Additionally, while shown with equidistant spacing between the attachment points along the width and/or length of the insulation board 308, in some embodiments irregular spacing intervals may be used. Additionally, in some embodiments more or fewer rows or columns of attachment points 310 may be utilized.

It will be appreciated that the fastening patterns disclosed in relation to FIGS. 3A-3C are merely meant as examples and that numerous other fastening patterns may be utilized in accordance with the present invention. For example, fastening patterns having any number of attachment points in any arrangement may be used. Oftentimes, rooftop applications and/or locations may require greater numbers of attachment points in areas that are subject to higher wind loads.

Figure 4:
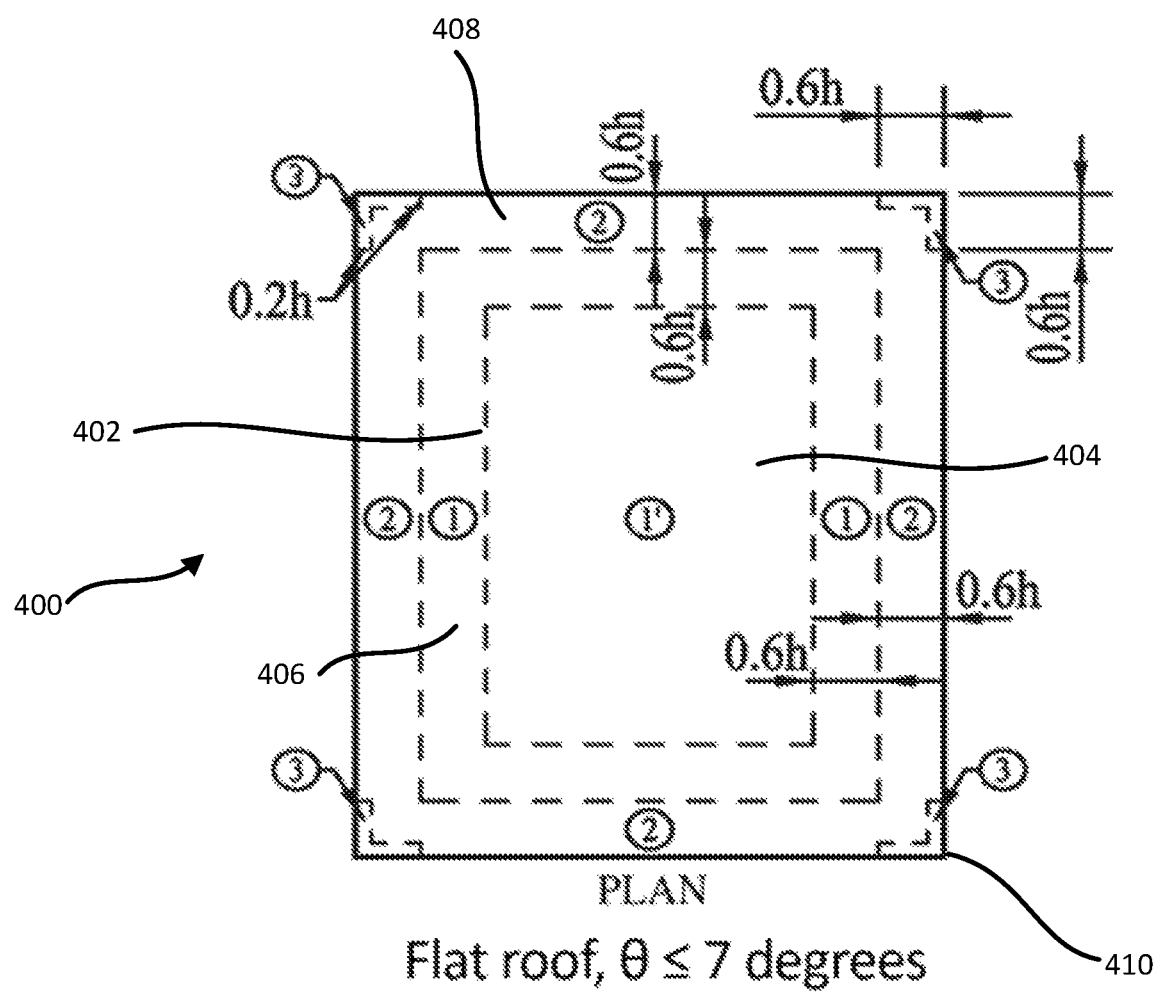
FIG. 4 depicts a schematic depicting wind load requirements according to embodiments of the invention.

FIG. 4 illustrates one example of a wind load requirements for a flat (low slope) roof application having a slope of less than about 7 degrees relative to horizontal. Such wind load requirements may be applicable in most environments, however extreme environments, such as high wind coastal areas may have different designs. As illustrated in FIG. 4, a roof 400 may be divided into 3 primary zones. A first "field" zone 402 is provided that encompasses a central portion of the roof 400. In some embodiments, the field zone 402 may be subdivided into a most central field portion 404 and a peripheral field portion 406. The most central field portion 404 may have an outer boundary that is positioned approximately 1.2 times (although in some embodiments this may range from between 0.6 and 1.8) the distance between the ground and the roof 400. The peripheral field portion 406 may have an outer boundary that is positioned approximately 0.6 times (although in some embodiments this may range from between 0.3 and 1.2) the distance between the ground and the roof 400. The field zone 402 typically experiences lower wind loads than the outer layers of the roof 400. Accordingly, insulation boards in the field zone 402 may utilize fastening patterns that may include a smaller number of attachment points. For example, field zone 402 typically includes between about 6 and 10 attachment points (typically about 8), although other numbers are possible. Encircling the field zone 402 is a perimeter zone 408 that borders an outer portion of the peripheral field portion 406 and extends toward edges of the roof 400. In some embodiments, the perimeter zone 408 may extend entirely to a portion of the roof 400. For example, the perimeter zone 408 will extend to all the sides of the roof 400, with the exception of the corners of the roof.

Perimeter zone 408 typically experiences greater wind loads that the field zone 402 and accordingly often has insulation boards with greater number of attachment points. For example, between about 10 and 24 attachment points (typically between 12 and 20, and more commonly about 16) may be used to secure each of the insulation boards in the perimeter zone 408, although other numbers of attachment points may be utilized in a particular application. Roof 400 may also include corner zones 410, which are positioned near and include the corners of the roof 400. In some embodiments, the corner zones 410 may have a thickness of about 0.2 times (although in some embodiments this may range from between 0.05 and 0.35) the distance between the ground and the roof 400 as measured from a nearest edge of the roof 400. The corner zones 410 may extend along adjacent edges of the roof 400 for a distance of about 0.6 times (although in some embodiments this may range from between 0.3 and 1.2) the distance between the ground and the roof 400. Corner zones 410 typically experience the highest wind loads of roof 400 and therefore often have insulation boards secured by the highest number of attachment points. For example, the insulation boards of the corner zones 410 may include between about 24 and 42 attachment points (more typically about 32), although other numbers of attachment points may be utilized in a particular application.

As noted above, the attachment points of each insulation board represent roof plates, which may be used as possible magnetic attachment points for a frame for securing rooftop equipment to the roof 400. A particular frame may be mounted on a single insulation board in a single zone and/or may span multiple insulation boards and/or multiple roof zones. In some embodiments, a single roofing board may span multiple roof zones. In such embodiments, the insulation board may have a fastening pattern consistent with a single one of the zones (often the highest load pattern), however in some embodiments the insulation board may have a hybrid fastening pattern that includes portion having fastening patterns matching that of a roofing zone within which each portion is positioned. It will be appreciated that the wind load design requirements illustrated in FIG. 4 are merely one example, and that other designs are possible. Additionally, based on the size and shape of the building and/or roof, additional or fewer roofing zones may be utilized. Additionally, similar design techniques may be possible in non-rectangular roof designs.

The arrangement of roofing plates based on roofing zones may also at least partially determine a layout of mounting supports and/or magnet element characteristics. For example, a number of mounting supports and/or a density of mounting supports in a particular region/zone of a roof may be selected based on a layout of the metallic roof plates on the rooftop. As just one example, equipment (or portions thereof) positioned near corner of the roof may utilize a greater number and/or density of mounting supports and attachment points than equipment (or portions thereof) positioned near a center of the roof. Similarly, magnetic elements may be selected to have greater magnetic forces near corner regions and/or a greater number of magnetic elements may be used.

FIG. 5 is a flowchart illustrating a process 500 for installing rooftop equipment to a roof. Process 500 may begin at block 502 by providing rooftop equipment to be placed atop a roof of a building structure. The rooftop equipment may include solar panels, satellite communications equipment, antennas, HVAC systems, other communications systems, and/or other equipment.

The roofing equipment may include or be coupled with a roofing rack or mounting frame, similar to frame 114 and/or frame 200, which is usable to attach the roofing equipment to the roof structure and may include a number of legs, mounting supports, and/or magnetic elements. At block 504, a placement of a plurality of metallic roof plates positioned about an area of the roof may be determined. This may be done in several ways. For example, roofing design plans may be consulted to determine the location of the roof plates. In other embodiments, the roof plates may be detected using a metal detector, stud finder, and/or other detection means. A total amount of magnetic force needed to secure the rooftop equipment may be determined at block 506. The total amount of magnetic force (which may or may not include a factor of safety) may be based at least in part on a relative location of a final position of the rooftop equipment on a top of the roof. For example, the total amount of magnetic force needed may be based on the same and/or similar design applications as the wind load requirements described in relation to FIG. 4 and may vary based on whether all or part of the roofing equipment is being mounted in the field zone, perimeter zone, and/or corner zone. For example, Wind load on roof and rooftop equipment is most commonly calculated using ASCE-7 (in particular ASCE 7-16), the complete disclosure of which is herein incorporated by reference. It will be appreciated that in some embodiments, the roofing equipment may span multiple roof zones and as a result, may have different securement force requirements at different locations of the roofing equipment.

At block 508, a plurality of mounting supports of the rooftop equipment are positioned above at least some of the plurality of metallic roof plates. In some embodiments, positioning the mounting supports of the rooftop equipment includes adjusting a length, a width, and/or height of a frame of the rooftop equipment on which the plurality of mounting supports are secured. For example, legs of the frame on which the mounting supports and magnetic elements are affixed may be telescoped, extended retracted, pivoted, rotated, and/or otherwise manipulated to adjust the positions of the mounting supports. The positioning, density, and number of mounting supports may be evenly distributed along the roofing equipment and/or may vary in some or all locations of the roofing equipment based on securement requirements associated with a location on the roof within which a particular portion of the roofing equipment (or frame) is secured to the roof structure. Each of the plurality of mounting supports may include at least one magnetic element that is configured to secure a particular one of the plurality of mounting supports with a particular one of the plurality of metallic roof plates.

A magnetic force of each of the magnetic elements is based at least in part on the total amount of magnetic force and a number of the plurality of mounting supports of the rooftop equipment. For example, if a frame is mounted entirely within one zone of the roof, each of the magnetic elements may have the same mounting force, which may be equal to a set percentage of the total magnetic force needed. For example, if 8 magnetic elements are included on a single frame, then each magnetic element may have a magnetic force equal to approximately ⅛ of the total force needed to secure the roofing equipment to the roof structure. In other embodiments, some or all of the magnetic elements may have different magnetic forces, which may be particularly useful in embodiments in which a frame spans multiple roofing zones that having different fastening requirements. In embodiments in which the magnetic elements include electromagnets, the magnetic elements may be approximately identical to one another while still allowing some or all of the magnetic elements to produce different amounts of magnetic forces by adjusting a current supplied to the electromagnetic elements. For example a current supplied to each of the electromagnets may be varied to adjust the magnetic force of each of the magnetic elements sum to equal or exceed the total amount of magnetic force needed. In some embodiments, especially those in which the roofing equipment includes communications equipment, the process 500 may optionally include installing magnetic shielding around at least a portion of the some or all of the magnetic elements.

The methods, systems, and devices discussed above are examples. Some embodiments were described as processes depicted as flow diagrams or block diagrams. Although each may describe the operations as a sequential process, many of the operations can be performed in parallel or concurrently. In addition, the order of the operations may be rearranged. A process may have additional steps not included in the figure.

It should be noted that the systems and devices discussed above are intended merely to be examples. It must be stressed that various embodiments may omit, substitute, or add various procedures or components as appropriate. Also, features described with respect to certain embodiments may be combined in various other embodiments. Different aspects and elements of the embodiments may be combined in a similar manner. Also, it should be emphasized that technology evolves and, thus, many of the elements are examples and should not be interpreted to limit the scope of the invention.

Specific details are given in the description to provide a thorough understanding of the embodiments. However, it will be understood by one of ordinary skill in the art that the embodiments may be practiced without these specific details. For example, well-known structures and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing embodiments of the invention. Various changes may be made in the function and arrangement of elements without departing from the spirit and scope of the invention.

Having described several embodiments, it will be recognized by those of skill in the art that various modifications, alternative constructions, and equivalents may be used without departing from the spirit of the invention. For example, the above elements may merely be a component of a larger system, wherein other rules may take precedence over or otherwise modify the application of the invention. Also, a number of steps may be undertaken before, during, or after the above elements are considered. Accordingly, the above description should not be taken as limiting the scope of the invention.

Also, the words "comprise", "comprising", "contains", "containing", "include", "including", and "includes", when used in this specification and in the following claims, are intended to specify the presence of stated features, integers, components, or steps, but they do not preclude the presence or addition of one or more other features, integers, components, steps, acts, or groups.

Unless defined otherwise, all technical and scientific terms used herein have the same meaning as commonly or conventionally understood. As used herein, the articles "a" and "an" refer to one or to more than one (i.e., to at least one) of the grammatical object of the article. By way of example, "an element" means one element or more than one element. "About" and/or "approximately" as used herein when referring to a measurable value such as an amount, a temporal duration, and the like, encompasses variations of ±20% or ±10%, ±5%, or +0.1% from the specified value, as such variations are appropriate to in the context of the systems, devices, circuits, methods, and other implementations described herein. "Substantially" as used herein when referring to a measurable value such as an amount, a temporal duration, a physical attribute (such as frequency), and the like, also encompasses variations of ±20% or ±10%, ±5%, or +0.1% from the specified value, as such variations are appropriate to in the context of the systems, devices, circuits, methods, and other implementations described herein.

As used herein, including in the claims, "and" as used in a list of items prefaced by "at least one of" or "one or more of" indicates that any combination of the listed items may be used. For example, a list of "at least one of A, B, and C" includes any of the combinations A or B or C or AB or AC or BC and/or ABC (i.e., A and B and C). Furthermore, to the extent more than one occurrence or use of the items A, B, or C is possible, multiple uses of A, B, and/or C may form part of the contemplated combinations. For example, a list of "at least one of A, B, and C" may also include AA, AAB, AAA, BB, etc.

What is claimed is:

1. A rooftop equipment attachment system, comprising:
a rooftop comprising:
a roof deck;
an insulation layer positioned atop the roof deck;
a plurality of metallic roof plates that secure the insulation layer to the roof deck; and
a roofing membrane secured atop the insulation layer, wherein the roofing membrane covers the plurality of metallic roof plates; and
a frame for supporting rooftop equipment, the frame comprising:
a plurality of mounting supports that are positionable atop the rooftop at positions that are above at least a portion of the plurality of metallic roof plates, the plurality of mounting supports being configured to support the frame and any rooftop equipment mounted thereon, wherein:
each of the plurality of mounting supports comprises a magnetic element that is configured to secure a particular one of the plurality of mounting supports with a particular one of the plurality of metallic roof plates; and
at least some of the plurality of mounting supports are coupled to the frame using adjustable legs that enable a lateral position of each of the at least some of the plurality of mounting supports to be adjusted, thereby enabling each of the magnetic elements to be manipulated to a position that is above one of the plurality of metallic roof plates.

2. The rooftop equipment attachment system of claim 1, wherein:
wherein a magnetic force of each of the magnetic elements is based at least in part on a total amount of magnetic force needed to secure the rooftop equipment to the rooftop and a number of the plurality of mounting supports.

3. The rooftop equipment attachment system of claim 1, wherein:
a lateral surface area of each of the magnetic elements is substantially the same as a lateral surface area of each of the metallic roof plates.

4. The rooftop equipment attachment system of claim 1, wherein:
at least a portion of the frame comprises magnetic shielding material disposed between the magnetic elements and any roofing equipment mounted on the frame.

5. The rooftop equipment attachment system of claim 1, wherein:
a portion of the frame positioned more proximate to corners of the rooftop comprises mounting supports having magnetic elements with stronger magnetic forces than magnetic elements disposed on mounting supports of a portion of the frame positioned more proximate a center of the rooftop.

6. The rooftop equipment attachment system of claim 1, wherein:
the insulation layer comprises a plurality of roofing insulation boards.

7. The rooftop equipment attachment system of claim 1, wherein:
a portion of the frame positioned more proximate to corners of the rooftop comprises a greater density of mounting supports than a portion of the frame positioned more proximate a center of the rooftop.

8. A rooftop equipment attachment system, comprising:
a frame for supporting rooftop equipment; and
a plurality of mounting supports that are coupled with the frame, wherein:
the plurality of mounting supports are positionable atop a rooftop such that each of the plurality of mounting supports is disposed above at least one of a plurality of metallic roof plates provided in a structure of the rooftop;
the plurality of mounting supports are configured to support the frame and any rooftop equipment mounted thereon; and
each of the plurality of mounting supports comprises a magnetic element that is configured to secure a particular one of the plurality of mounting supports with a particular one of the plurality of metallic roof plates, wherein:
each magnetic element comprises a generally flat bottom portion that sits above an uppermost surface of the particular one of the plurality of metallic roof plates without penetrating a roofing membrane positioned above the particular one of the plurality of metallic roof plates; and
at least some of the plurality of mounting supports are coupled to the frame using adjustable legs that enable a lateral position of each of the at least some of the plurality of mounting supports to be adjusted, thereby enabling each of the magnetic elements to be manipulated to a position that is above one of the plurality of metallic roof plates.

9. The rooftop equipment attachment system of claim 8, wherein:
each of the adjustable legs is laterally translatable along two lateral axes.

10. The rooftop equipment attachment system of claim 8, wherein:
a lowermost surface of each of the plurality of mounting supports comprises a smooth surface with rounded edges.

11. The rooftop equipment attachment system of claim 8, wherein:
one or both of a number of the plurality of mounting supports or a density of the plurality of mounting supports is selected based on a layout of the plurality of metallic roof plates on the rooftop.

12. The rooftop equipment attachment system of claim 8, wherein:
a magnetic force of each of the magnetic elements is selected based on a total magnetic force needed to secure the rooftop equipment to the rooftop and a number of the plurality of mounting supports.

13. The rooftop equipment attachment system of claim 12, wherein:
the total magnetic force is based at least in part on a relative location of a final position of the frame on a top of the roof.

14. A method of installing rooftop equipment to a roof, comprising:
providing rooftop equipment to be placed atop a roof of a building structure;
determining a placement of a plurality of metallic roof plates positioned about an area of the roof;
determining a total amount of magnetic force needed to secure the rooftop equipment, wherein the total amount of magnetic force is based at least in part on a relative location of a final position of the rooftop equipment on a top of the roof; and positioning a plurality of mounting supports of the rooftop equipment above at least some of the plurality of metallic roof plates, each of the plurality of mounting supports comprising a magnetic element that is configured to secure a particular one of the plurality of mounting supports with a particular one of the plurality of metallic roof plates, wherein:

a magnetic force of each of the magnetic elements is based at least in part on the total amount of magnetic force and a number of the plurality of mounting supports of the rooftop equipment; and positioning the plurality of mounting supports of the rooftop equipment comprises adjusting one or both of a length or a width of a frame of the rooftop equipment on which the plurality of mounting supports are secured.

15. The method of installing rooftop equipment to a roof of claim 14, wherein:

the magnetic elements comprise electromagnets; and the method further comprises adjusting a current to each of the electromagnets to adjust the magnetic force of each of the magnetic elements sum to equal or exceed the total amount of magnetic force.

16. The method of installing rooftop equipment to a roof of claim 14, wherein:

determining the placement of the plurality of metallic roof plates comprises detecting the plurality of metallic roof plates using a metal detector.

17. The method of installing rooftop equipment to a roof of claim 14, wherein:

determining the total amount of magnetic force is based at least in part on wind load requirements for a portion of the area of the roof on which the rooftop equipment is to be affixed.

18. The method of installing rooftop equipment to a roof of claim 14, further comprising:

installing magnetic shielding around at least a portion of the magnetic elements.

19. A mounting support, comprising:

a mounting support body that is positionable atop a rooftop such that the mounting support body is disposed above a metallic roof plate provided in a structure of the rooftop, the mounting support body defining a receptacle, wherein the mounting support body is configured to support rooftop equipment mounted thereon;

a magnetic element disposed within the receptacle, the magnetic element being configured to secure the mounting support body with the metallic roof plate, wherein the magnetic element comprises a generally flat bottom portion that sits above an uppermost surface of the metallic roof plate without penetrating a roofing membrane positioned above the metallic roof plate; and a frame coupled with the mounting support body, wherein the mounting support is coupled to the frame using an adjustable leg that enables a lateral position the mounting support body to be adjusted relative to the frame.

* * * * *